United States Patent [19]

Sako

[11] Patent Number: 5,049,977
[45] Date of Patent: Sep. 17, 1991

[54] PLASTIC MOLDED TYPE SEMICONDUCTOR DEVICE

[75] Inventor: Shigeki Sako, Yokohama, Japan

[73] Assignee: Kabushiki Kaisha Toshiba, Kawasaki, Japan

[21] Appl. No.: 551,442

[22] Filed: Jul. 12, 1990

[30] Foreign Application Priority Data

Jul. 18, 1989 [JP] Japan ................................. 1-185623

[51] Int. Cl.5 ..................... H01L 23/28; H01L 23/16; H01L 29/52; H01L 29/44
[52] U.S. Cl. ........................................ 357/72; 357/70; 357/75; 174/52.4; 361/420; 361/421
[58] Field of Search ...................... 357/70, 72, 75, 68; 174/52.4; 361/420, 421

[56] References Cited

U.S. PATENT DOCUMENTS

| 4,788,583 | 11/1988 | Kawahara et al. | 357/72 |
| 4,800,419 | 1/1989 | Long et al. | 357/70 |
| 4,855,807 | 8/1989 | Yamaji et al. | 357/72 |

FOREIGN PATENT DOCUMENTS 0259550  11/1986  Japan ..................................... 357/72

Primary Examiner—Rolf Hille
Assistant Examiner—David Ostrowski
Attorney, Agent, or Firm—Finnegan, Henderson, Farabow, Garrett and Dunner

[57] ABSTRACT

A plurality of leads and two islands are arranged on a lead frame made of a conductive metal. Semiconductor chips, substrates of which have different thicknesses, are mounted on the two islands, and the lead frame is bent and formed such that the chip mounting surfaces of both the islands are lower than the upper surfaces of the corresponding leads by different amounts.

7 Claims, 3 Drawing Sheets

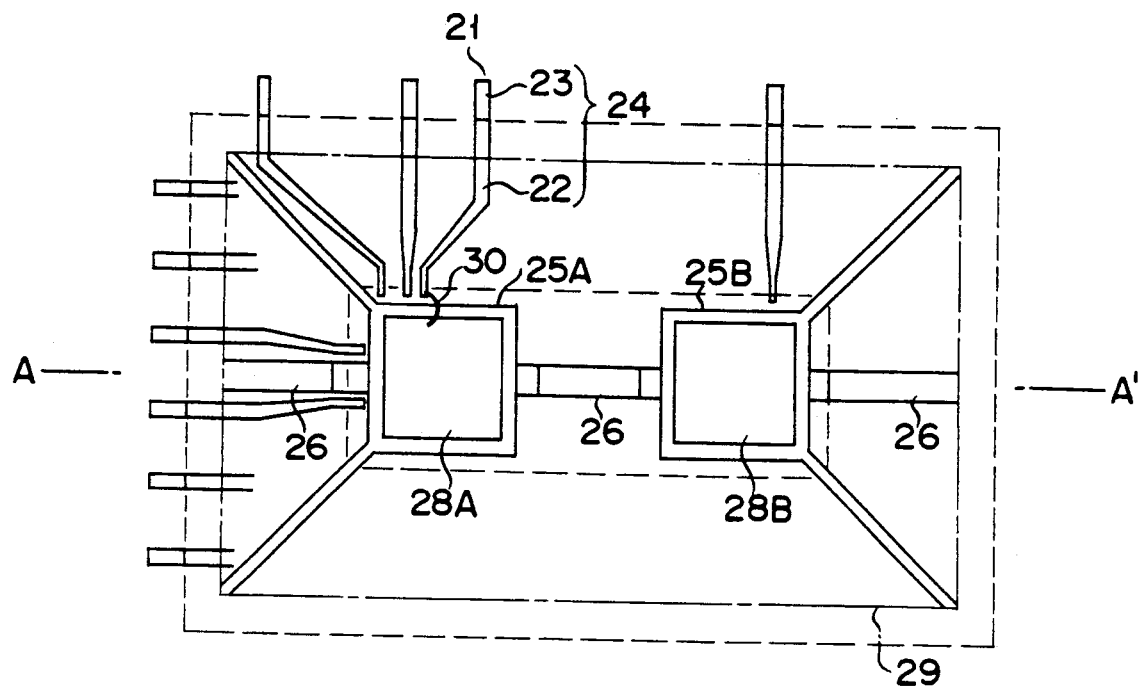
F I G. 3
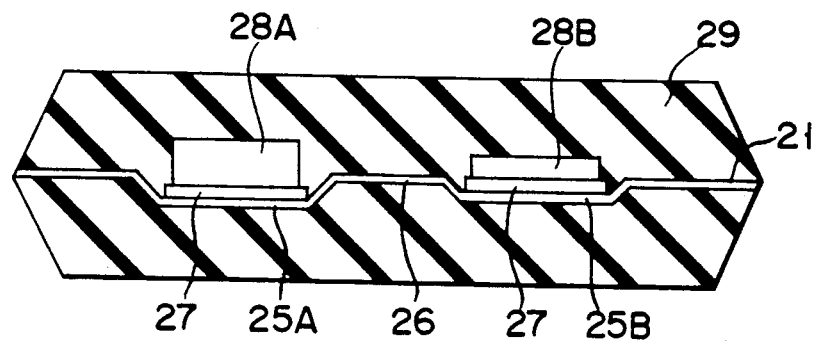
F I G. 4

PLASTIC MOLDED TYPE SEMICONDUCTOR DEVICE

BACKGROUND OF THE INVENTION

1. Field of the Invention

The present invention relates to a plastic molded type semiconductor device and, more particularly, to a semiconductor device including a package having a thin plastic molding layer.

2. Description of the Related Art

In recent years, integrated chip (IC) devices having a high degree of integration have been developed. The IC device is required to be compact. An IC device generally has a shape suitable for surface mounting. In order to cope with the above situation, an IC device having a large number of pins is required in accordance with the remarkable increase in the integration density of elements. Therefore, various developments have been performed.

As a part of the developments, a plastic molding material has been improved. The Bare Chip concept is incorporated in an assembling step of a semiconductor element and especially in a plastic molding step.

A lead frame method, mainly performed as an assembling step of a semiconductor element, has been frequently applied to DIP (Dual In Line Package) type IC devices having a large number of pins or SIP (Single In Line Package) type IC devices or the like.

A lead frame of a given type has a frame obtained by punching or photoetching a thin conductive metal plate and a plurality of leads which extend from the edge to the center of the frame. The distal ends of the leads are free distal ends. An island for mounting a semiconductor chip, such as a semiconductor integrated circuit chip, is formed near the free distal ends of the leads. The island and the plurality of leads are formed by a punching process or a photoetching technique at the same time as the formation of the frame.

The number of semiconductor chips which can be mounted on one island is limited. For this reason, a large number of islands, each having an area in which a semiconductor chip can be mounted are formed, and a lead frame on which a plurality of semiconductor chips can be fixed, is developed. Using this lead frame, a hybrid system module product in which a desired electric circuit is constituted by a plurality of chips is produced.

In an assembling step using a lead frame, a semiconductor chip must be electrically connected to a lead prospectively serving as an inner lead. For this reason, a pad formed on the semiconductor chip and made of a conductive metal plate electrically connected to an active element or a passive element is electrically connected to the lead through a thin metal wire by a bonding method or an ultrasonic bonding method. A flat plate-like lead frame in which a plurality of leads and an island are arranged on the same plane is usually used. In some cases, a lead frame in which a mounting surface of the island for the semiconductor chip is lower than the upper surface of another lead, i.e., a so-called depressed type or island down type lead frame may be used.

FIG. 1 is a conventional IC device using a normal flat plate-like lead frame. Referring to FIG. 1, reference numeral 11 denotes a lead frame. Two islands 12A and 12B are formed on the lead frame 11. Semiconductor chips 14A and 14B are respectively mounted on the islands 12A and 12B through an adhesive 13. Reference numeral 15 denotes a package made of a molded plastic. Note that, in FIG. 1, a thin metal wire connected by a bonding method is omitted.

FIG. 2 shows a conventional IC device using a depressed type or island down type lead frame. In the IC device, reference numeral 11 denotes a lead frame; 12A and 12B, islands; 13, an adhesive; 14A and 14B, semiconductor chips; and 15, a package.

Connection between each pad on a semiconductor chip and the corresponding lead by a thermo-compression bonding method or an ultrasonic thermo-compression bonding method is performed in the following manner. Each metal thin wire held by a bonder serving as a bonding device is compressed and thermally bonded on, e.g., the corresponding pad at the end of a tool at a predetermined temperature in a predetermined atmosphere, and the tool is moved along a predetermined track on the lead to bond the line to the lead by wedge bonding. As a result, a loop-like metal thin wire is connected between both the thermal bonding points.

In the IC device in FIG. 2, a mounting surface of each island is arranged to be uniformly lower than the upper surface of a lead by 0.15 mm to 0.2 mm.

After mounting a semiconductor chip on an island, a package having predetermined outer dimensions is formed through a plastic molding step by a transfer molding method. In this step, a pair of upper and lower metal molds are set on a plastic molding device, a lead frame is stored in a cavity formed in the lower metal mold, and a molten molding plastic is flowed inside the cavity. Arrows in FIGS. 1 and 2 represent paths along which the molten molding plastic flows in the cavity.

There is a semiconductor chip in which a current is supplied in a direction of the thickness of a semiconductor substrate. Electric characteristics of this semiconductor chip is affected by the thickness of the semiconductor substrate. For this reason, in this semiconductor chip, the thickness of the semiconductor substrate is changed in accordance with its characteristics. Therefore, when each chip mounting surface of all islands is uniformly lower than the upper surface of the corresponding lead, the following drawback occurs during a plastic molding step. That is, semiconductor chips having different thicknesses are mounted on a plurality of islands, a lead frame is stored in a cavity, and a molding plastic flows in the cavity. At this time, differences in flow rate and speed of the molten molding plastic between upper and lower portions occur within the cavity with respect to the lead frame as the center. Therefore, unsatisfactory filling of the plastic occurs. This phenomenon becomes conspicuous when the thickness of the plastic molding layer, i.e., the thickness of the package is smaller than 1.5 mm.

This unsatisfactory filling of plastic causes not only degradation of an outer appearance of the package but formation of a void inside the package. The void generates thermal stress and causes the thin metal wires bonded by the thermal bonding method to disconnect. In addition, the void allows entrance of moisture to degrade a moisture resistance.

Thus, the unsatisfactory filling of the plastic causes degradation of reliability of a semiconductor device

SUMMARY OF THE INVENTION

It is, therefore, an object of the present invention, to provide a highly reliable plastic molded type semiconductor device which has a plurality of islands on which semiconductor chips are mounted and mounting surfaces of the islands lower than the upper surface of leads, wherein, when semiconductor chips having different substrate thicknesses are mounted on the islands, unsatisfactory filling of a molding plastic or formation of voids in a molding plastic constituting a package do not occur.

According to the present invention, there is provided a plastic molded type semiconductor device comprising a flat plate-like lead frame made of a conductive metal, a plurality of islands a surface of each of which is lowered from that of the lead frame by a predetermined amount upon bending of one part of the lead frame so as to lower the plurality of islands from the other part of the lead frame, a plurality of semiconductor chips respectively mounted on the plurality of islands and constituted by semiconductor substrates each having a predetermined thickness, and a package for burying and molding the semiconductor chips and made of a plastic material, wherein a lowering amount of the surface of each island from the lead frame is determined in accordance with a thickness of the substrate of each semiconductor chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a plan view a semiconductor device according to the first embodiment of the present invention;

FIG. 4 is a sectional view showing the semiconductor device according to the first embodiment of the present invention;

DETAILED DESCRIPTION OF THE PREFERRED EMBODIMENTS

Figure 1:
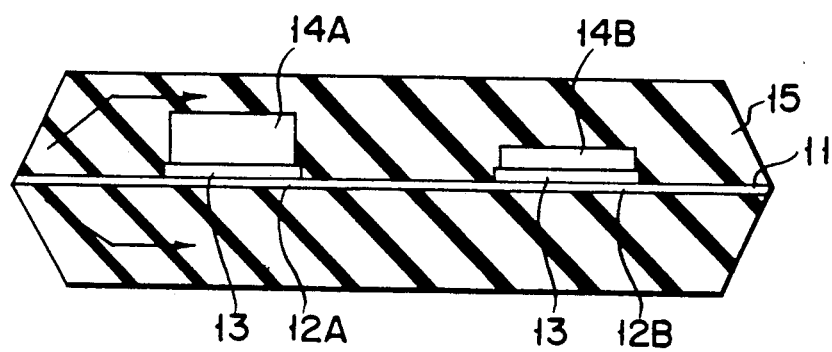
FIG. 1 is a sectional view showing a conventional device.
Figure 2:
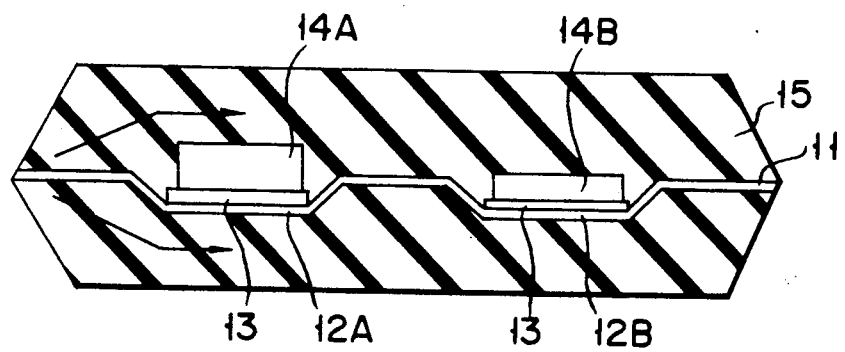
FIG. 2 is a sectional view showing another conventional device.

An embodiment of the present invention will be described below with reference to the accompanying drawings.

FIG. 3 is a plan view showing an arrangement of a semiconductor device according to the first embodiment of the present invention in which a plastic molded type semiconductor device according to the present invention is applied to a QFP (Quad Flat Package) type IC device. Note that, in the device shown in FIG. 3, a boundary of a package made of a plastic is represented by an alternate long and short dashed line, and FIG. 4 is a sectional view showing the device taken along a line A—A' in FIG. 3.

In FIGS. 3 and 4, reference numeral 21 denotes a lead frame obtained by punching or photoetching a metal thin plate made of iron, an alloy of iron and nickel, copper, or an alloy of copper. The lead frame is constituted by a plurality of leads 24 having a plurality of inner leads 22 the distal ends of which are free ends and outer leads 23 formed integrally with the inner leads 22, and two islands 25A and 25B for mounting semiconductor chips such as semiconductor integrated circuit chips. The islands 25A and 25B are formed near the free ends of the inner leads 22.

The two islands 25A and 25B are connected to each other by a connecting portion 26. The connecting portion 26 is bent and formed to arrange a mounting surface of each semiconductor chip at a level lower than the upper surface of each of the plurality of leads 24. Two semiconductor chips such as semiconductor integrated circuit chips 28A and 28B are respectively mounted and fixed on the two islands 25A and 25B by an adhesive 27. The resultant structure is molded by a package 29 made of an insulating resin such as an epoxy-based resin material.

The chips 28A and 28B can be obtained by forming an impurity region of an opposite conductivity type on, e.g., a silicon semiconductor substrate of a given conductivity type according to a known method, and b connecting electrodes or wirings made of a conductive metal to the impurity region. The chips 28A and 28B are made of silicon semiconductor substrates having different thicknesses in accordance with characteristics of the chips. For example, each thickness falls within the range of 130 μm to 400 μm.

In the semiconductor device shown in FIGS. 3 and 4, adjustment for lowering the surface of an island can be performed in accordance with the thickness of the semiconductor chip, which is a characteristic feature of the present invention. That is, the surface of the island 25A on which the semiconductor integrated circuit chip 28A having a relatively large thickness is mounted is lowered by a large amount, and the surface of the island 25B on which the semiconductor integrated circuit chip 28B having a relatively small thickness is mounted is lowered by a small amount.

A plastic molding step for forming the package 29 is performed in the following manner. For example, an insulating plastic tablet of an epoxy-based resin stored in a pot of a special-purpose molding device is compressed and melted through a cull and a runner, and the molten plastic flows through the gate of a cavity formed by a lower metal mold which stores a semiconductor chip. The thickness of the plastic package, i.e., a plastic molding layer is set to be smaller than 1.5 mm for surface mounting preparation as described above.

Electrodes or bonding pads made of a conductive metal and formed on the semiconductor chip are electrically connected to the inner leads by an ultrasonic wire bonding step or a wire bonding step performed using a metal thin wire before the plastic molding step. At this time, the metal thin wire is illustrated by reference numeral 30 in FIG. 3. At this time, a loop of the thin metal wire is formed to have a height of about 300 μm. A thin metal wire having a diameter of about 50 μm and made of gold, copper, or aluminum is generally used. When a thin copper wire is used, a lead frame made of copper or an alloy of copper must be used. Furthermore, a thermal bonding step is performed in an inert atmosphere, and it must be considered to prevent oxidation of the copper thin wire and the thin aluminum wire.

Since a lowering amount of the surface of the island is naturally limited by the formation of the loop having a height of 300 μm in the thermally bonding step and the thickness of 1.5 mm of the plastic molding layer for surface mounting preparation, the island must have a minimum thickness of 100 μm from the surface to serve as a material having moisture resistance or a protective material. Therefore, the lowering amount of the surface of the island falls within the range of 0.2 mm. Note that a plastic-molded semiconductor chip is ejected by an ejector pin arranged in a special-purpose device to separate the package from the molds, and a mark formed on the end surface of the ejector pin is embossed in the package.

Note that the present invention is not limited to the above embodiment, and various modifications can be performed. For example, in the above embodiment, the case wherein two islands are provided has been described. However, the number of islands is not limited to two, and three or more islands may be provided.

In the present invention, since a lowering amount of the surface of an island is changed in accordance with semiconductor chips having different thicknesses, in a plastic molding step, unsatisfactory filling of a plastic does not occur. Therefore, a thin metal wire is not disconnected by thermal stress, and moisture resistance is improved.

Figure 5:
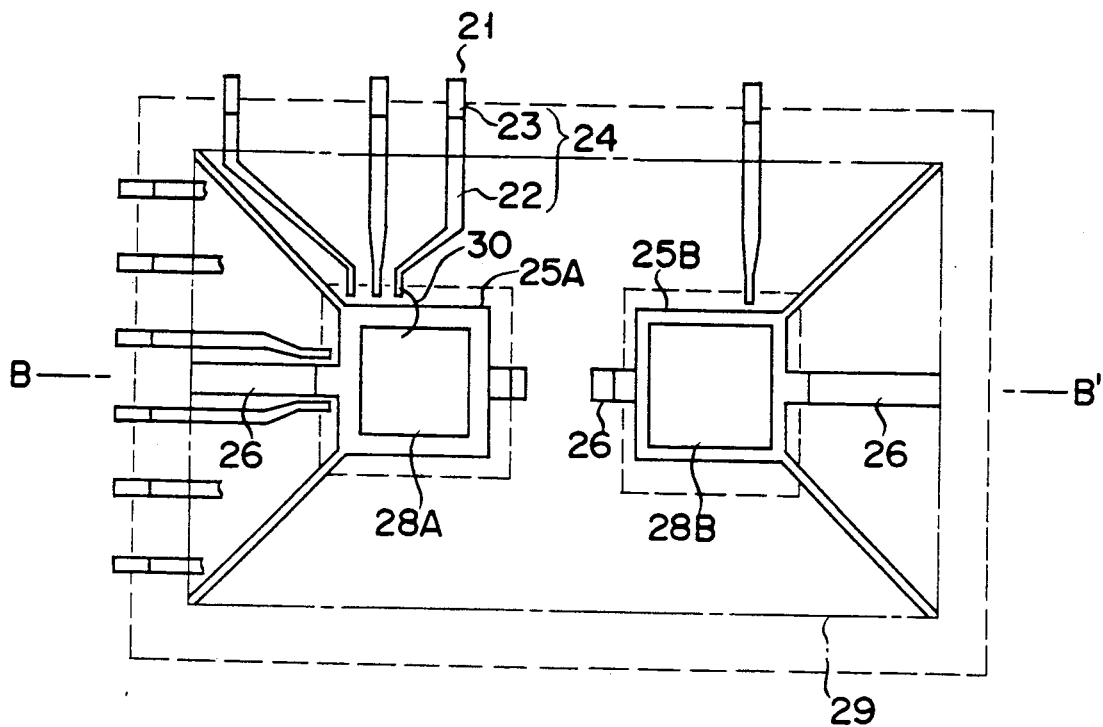
FIG. 5 is a plan view showing a semiconductor device according to the second embodiment of the present invention.
Figure 6:
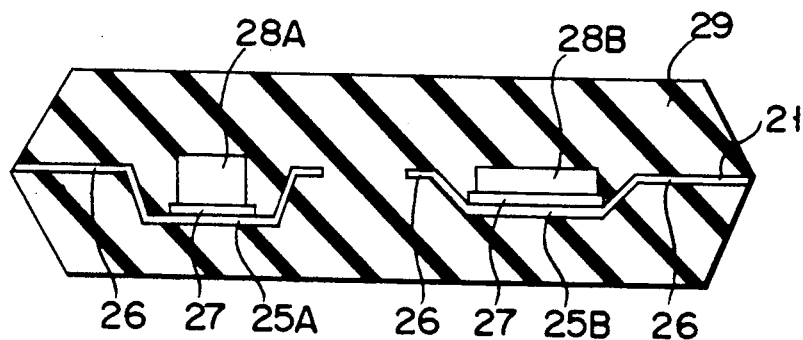
FIG. 6 is a sectional view showing the semiconductor device according to the second embodiment of the present invention.

FIG. 5 is a plan view showing an arrangement of a plastic molded type semiconductor device according to the second embodiment of the present invention. Note that a boundary of a package 29 made of a plastic is represented by an alternate long and two short dashed line. FIG. 6 is a sectional view showing the device taken along a line B—B' in FIG. 5. A different portion between the device of this embodiment and the device of the above embodiment shown in FIGS. 3 and 4 is that a connecting portion 26 for connecting two islands 25A and 25B is cut in a half way. Therefore, the same reference numerals in FIGS. 5 and 6 denote the same parts as in FIGS. 3 and 4, and a detailed description thereof will be omitted.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A resin-molded type semiconductor device comprising:
   a metal plate-like lead frame being partially bent and having an upper surface;
   at least two islands, each having an upper surface located below the upper surface of said lead frame, the upper surface of each of said at least two islands being spaced from the upper surface of said lead frame by a different distance;
   at least two semiconductor chips, at least one of said chips mounted on each of said at least two islands, said at least two semiconductor chips having substrates of different thicknesses; and
   a resin package containing said semiconductor chips;
   wherein the distances between the upper surfaces of said lead frame and the upper surfaces of said at least two islands and determined in accordance with the thicknesses of said substrates.

2. The device according to claim 1, wherein the distances between the upper surface of said lead frame and the upper surfaces of said at least two islands are proportional to the thicknesses of said substrates.

3. The device according to claim 1, wherein said package has a thickness of at most 1.5 mm.

4. The device according to claim 1, wherein the thicknesses of said substrates fall within a range from about 130 μm to about 400 μm.

5. A resin-molded type semiconductor device comprising:
   a metal plate-like lead frame partially bent and having an upper surface;
   a first island having an upper surface located below the upper surface of said lead frame and spaced from the upper surface of said lead frame by a first distance;
   a second island having an upper surface located below the upper surface of said lead frame and spaced from the upper surface of said lead frame by a second distance shorter than the first distance;
   a first semiconductor chip mounted on said first island, said first semiconductor chip having a semiconductor substrate having a third thickness;
   a second semiconductor chip mounted on said second island, said first semiconductor chip having a semiconductor substrate having a fourth thickness less than the third thickness; and
   a resin package containing said first and second semiconductor chips.

6. The device according to claim 5, wherein said package has a thickness of at most 1.5 mm.

7. The device according to claim 5, wherein said third and fourth thicknesses fall within a range from about 130 μm to about 400 μm.

* * * * *